United States Patent [19]

Larson

[11] Patent Number: 4,752,765
[45] Date of Patent: Jun. 21, 1988

[54] APPARATUS, METHOD AND ALGORITHM FOR ENCODING AND DECODING CHARACTERS IN A MESSAGE TO BE TRANSMITTED BETWEEN A FIRST SYSTEM AND A SECOND SYSTEM

[75] Inventor: Lawrence E. Larson, Vestal, N.Y.

[73] Assignee: International Business Machines Corporation, Armonk, N.Y.

[21] Appl. No.: 838,084

[22] Filed: Mar. 10, 1986

[51] Int. Cl.[4] .............................................. H03M 7/00
[52] U.S. Cl. ............................ 340/347 DD; 178/2 B; 178/113
[58] Field of Search ................ 340/347 DD; 178/2 B, 178/113

[56] References Cited

U.S. PATENT DOCUMENTS 4,649,231  3/1987  Marbet ................................ 178/2 B Primary Examiner—T. J. Sloyan
Attorney, Agent, or Firm—John H. Bouchard

[57] ABSTRACT

A first data processing system sends a message to a second data processing system via a modem. A processor of the first data processing system executes the instructions of an encoding algorithm stored in a memory of the first data processing system thereby encoding the characters of the message as the message is sent from the first system to the second system. The processor, in conjunction with the encoding algorithm, encodes the characters of the message by locating unacceptable characters among the acceptable characters in the message, the unacceptable characters possessing more than one meaning and triggering the execution of a function other than the intended function. The acceptable characters do not possess any alternative meanings. A bias code is selected for the acceptable characters and a further bias code is selected for the unacceptable characters. The unacceptable characters are converted into modified acceptable characters. The bias code, acceptable characters, further bias code, and modified acceptable characters are transmitted from the first data processing system to the second data processing system. The second system interprets the bias code to mean that the acceptable characters should be accepted without alteration, but interprets the further bias code to mean that the modified acceptale characters should be re-converted into the original unacceptable characters. Since the second system received the unacceptable characters in modified acceptable character form, only the intended function of the character will be executed.

6 Claims, 6 Drawing Sheets

AVAILABLE DATA CHARACTERS

UNENCODED ORIGINAL MESSAGE
ENCODED MESSAGE

UNENCODED ORIGINAL MESSAGE
ENCODED MESSAGE

AVAILABLE DATA CHARACTERS

X'10,X'10,X'50,X'51,X'52,X'53,X'0D

X'75,X'60,X'60,X'70,X'50,X'51,X'52,X'53,X'75,X'5D

| BIAS CODES (HEX NUMBER) | FIRST POSITION | DELTA CODES (HEX NUMBER) |
|---|---|---|
| 75 | 0 | 50 |
| 75 | 1 | 50 |
| 70 | 2 | 00 |
| 70 | 3 | 00 |
| 70 | 4 | 00 |
| 70 | 5 | 00 |
| 70 | 6 | 00 |
| 7B | 7 | B0 |
| 7B | 8 | B0 |
| 7B | 9 | B0 |
| 7B | A | B0 |
| 7B | B | B0 |
| 76 | C | 60 |
| 76 | D | 60 |
| 76 | E | 60 |
| 76 | F | 60 |

APPARATUS, METHOD AND ALGORITHM FOR ENCODING AND DECODING CHARACTERS IN A MESSAGE TO BE TRANSMITTED BETWEEN A FIRST SYSTEM AND A SECOND SYSTEM

BACKGROUND OF THE INVENTION

1. Field of the Invention

The subject invention pertains to computer systems, and more particularly, to an encoder and decoder for a computer system for encoding characters in a message prior to transmission from a first data processing system to a second data processing system thereby reducing the bandwidth or message length of the transmitted characters and increasing the transmission rate; and for decoding the encoded characters when the encoded characters are received by the second data processing system.

2. Description of the Prior Art

In computer systems, when a message is transmitted from a first data processing system to a second data processing system, the characters of the message are examined carefully by the first data processing system prior to transmission. For example, a computer terminal communicates with an attached telephone line through the use of a modem. A computer program stored in the modem examines each character of the message prior to transmission. Certain characters are reserved for specific control functions in the computer system, such as line feed and carriage return. When these certain characters are encountered, the computer program in the modem performs the particular control function. Therefore, if one or more of the certain characters appear as characters in the message to be transmitted, these certain characters in the message are unacceptable for transmission and must be converted to other characters which are acceptable for transmission, the conversion being done prior to transmission of the message by the modem from the computer terminal to the telephone line.

In the prior art, in order to avoid transmitting unacceptable characters, each original character in the message to be transmitted was duplicated such that two characters, corresponding to each original character, were transmitted. Using this prior art technique, the original message to be transmitted doubled in length. In addition, on the receiving end, since each original character of the message was duplicated, the second data processing system did not mis-interpret the meaning of the duplicated unacceptable characters; however, since the original message length was doubled, the transmission rate of the original message was cut approximately in half. The first data processing system (the modem and computer terminal) is capable of transmitting messages at a rate of 30 characters/second, but, using the prior art encoding technique, the first data processing system transmitted at a rate of 15 characters/second.

SUMMARY OF THE INVENTION

It is a primary object of the present invention to provide an encoding and decoding method and apparatus for increasing the character transmission rate of characters transmitted from a first data processing system to a second data processing system relative to prior art encoding and decoding methods.

It is a further object of the present invention to provide an encoding and decoding method and apparatus for compressing the message to be transmitted, thereby achieving a form of data compression, such that the length of the transmitted message using the encoding and decoding apparatus of the subject invention is less than the length of the transmitted message using the encoding and decoding apparatus of the prior art.

In accordance with these and other objects of the present invention, a message to be transmitted comprises unacceptable character codes and acceptable character codes. For each unacceptable character code in the message, a bias code is selected. A delta code, which is initially set to zero, is uniquely associated with the bias code. The delta code is added to (or subtracted from) the unacceptable character code to yield a modified acceptable character code. An acceptable encoded character, to be transmitted from a first data processing system to a second data processing system, consists of the bias code and the modified acceptable character code. When the bias code and the modified acceptable character code are received by the second data processing system, the bias code is cross-referenced to its corresponding delta code. The delta code is subtracted from (or added to) the received modified acceptable character code yielding the original unacceptable character code intended for transmission. If an acceptable character is intended for transmission from the first data processing system to the second data processing system, a further bias code is selected, and the acceptable character is transmitted, along with the further bias code, to the second data processing system. The second data processing system interprets the further bias code to mean that the acceptable character should remain unaltered and unchanged. The other characters in the message are encoded and decoded in the same manner as described above.

Further scope of applicability of the present invention will become apparent from the detailed description presented hereinafter. It should be understood, however, that the detailed description and the specific examples, while representing a preferred embodiment of the invention, are given by way of illustration only, since various changes and modifications within the spirit and scope of the invention will become obvious to one skilled in the art from a reading of the following detailed description.

BRIEF DESCRIPTION OF THE DRAWINGS

A full understanding of the present invention will be obtained from the detailed description of the preferred embodiment presented hereinbelow, and the accompanying drawings, which are given by way of illustration only and are not intended to be limitative of the present invention, and wherein.

DETAILED DESCRIPTION OF THE PREFERRED EMBODIMENT

Figure 1:
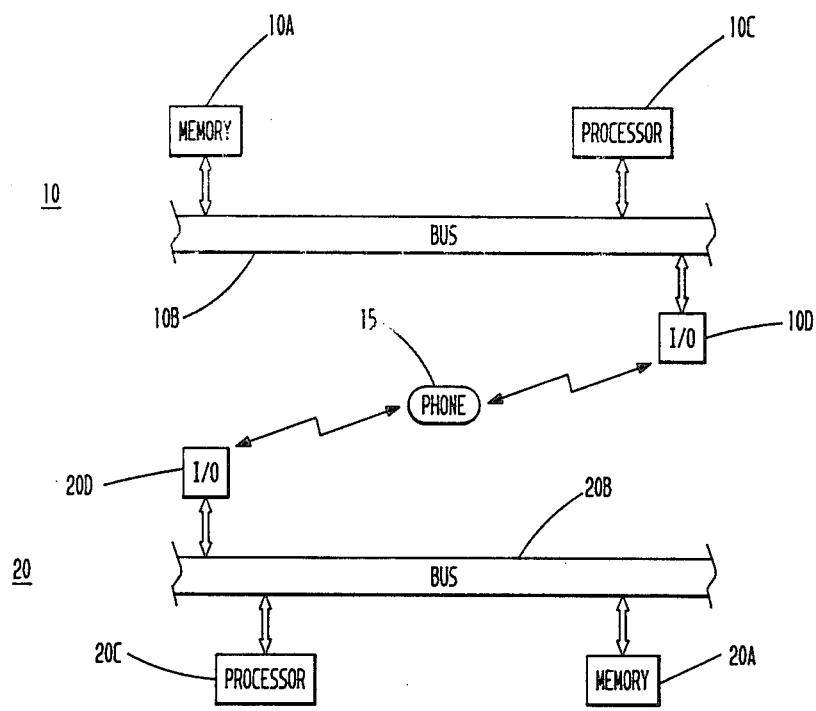
FIG. 1 illustrates a computer system including a first data processing system and a second data processing system.

Referring to FIG. 1, typical data processing systems are illustrated. In FIG. 1, a first, transmitting data processing system 10 includes a memory 10a connected to a system bus 10b, a processor 10c connected to the system bus 10b, and an input/output (I/O) peripheral device 10d connected to the system bus 10b. The processor 10c executes the instructions contained in the memory 10a and transmits the results to the I/O device 10d. A phone 15 is connected to the I/O device 10d and receives the transmitted results from the I/O device 10d. The phone 15 is further connected to a second, receiving data processing system 20, the phone 15 retransmitting the results received from the I/O device 10d to the second data processing system 20. The second data processing system 20 includes an input/output (I/O) peripheral device 20d connected to a system bus 20b, a processor 20c connected to the system bus 20b, and a memory 20a connected to the system bus 20b. The processor 20c executes the instructions stored in memory 20a. When the results are received from the first data processing system 10 via phone 15, the processor 20 executes the instructions stored in memory 20a for the purpose of interpreting the results received from the first data processing system 10 or performing some other function with respect to the results.

Figure 2:
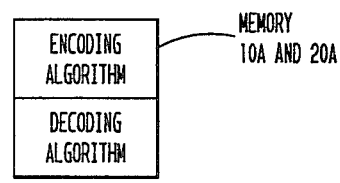
FIG. 2 illustrates the content of the memory portion of the data processing systems of FIG. 1.

Referring to FIG. 2, a schematic representation of the contents of memory 10a and 20a is illustrated. Memory 10a and memory 20a each contain an encoding algorithm and a decoding algorithm stored therein. Processors 10c and 20c execute the instructions of the encoding algorithm, and, as a result, encode the message data. Processors 10c and 20c also execute the instructions of the decoding algorithm, and, as a result, decode the encoded message data.

Referring to FIG. 1 in association with FIG. 2, processor 10c of the first data processing system contains message data which must be transmitted to processor 20c of the second data processing system 20. Processor 10c executes the instructions associated with the encoding algorithm stored in memory 10a, encoding the message data stored in the cache of processor 10c. The encoded message data is transmitted to the second data processing system 20 via I/O device 10d and phone 15 and is received by I/O device 20d. The processor 20c executes the instructions associated with the decoding algorithm stored in memory 20a, decoding the encoded message data received from the first data processing system 10. As a result, the original message data, originally stored in the cache of processor 10c, is extracted from the encoded message data received from the data processing system 10 and is stored in the cache of processor 20c. Since memory 20a contains the same encoding algorithm as present in memory 10a, the message data present in the cache of processor 20c can be encoded and transmitted, utilizing processor 20c and the encoding algorithm stored in memory 20a, in the same fashion that it was encoded via use of processor 10c. Similarly, processor 10c can perform a decoding function using the decoding algorithm stored in memory 10a.

The data processing systems shown in FIG. 1 may be any typical data processing system. For example, data processing systems 10 and 20 may be the system set forth in a manual entitled "IBM System/370 Principles of Operation", developed by International Business Machines, Corp., GA22-7000, the disclosure of which is incorporated by reference into the specification of this application. In addition, data processing system 10 and data processing system 20 may each be the IBM Personal Computer XT/370 Details of the construction and operation of the IBM PC XT/370 is set forth in detail in a technical reference manual entitled "Personal Computer XT/370 Hardware Reference Library", manual number 6361423, the disclosure of which is incorporated by reference into the specification of this application.

Figure 3A:
FIG. 3a illustrates a typical channel having a width "d" interconnecting the processor to the system bus and the system bus to the input/output (I/O) unit associated with each data processing system of FIG. 1.

Referring to FIG. 3a, a typical channel of width "d" is illustrated. This channel interconnects processor 10c and 20c to system bus 10b and 20b, and interconnects system bus 10b and 20b to input/output (I/O) units 10d and 20d.

Figure 3B:
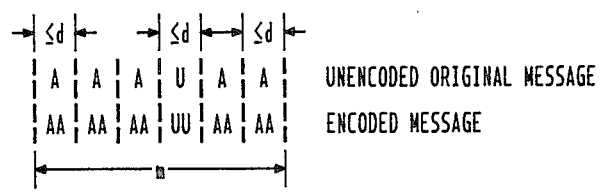
FIG. 3b illustrates an unencoded message and an encoded message which was encoded utilizing the encoding scheme of the prior art.

In FIG. 3b, an unencoded original message and an encoded message, encoded utilizing the encoding scheme of the prior art, is illustrated. The unencoded original message is: A, A, A, U, A, A. The "A" represents an acceptable character, one which does not possess any alternative meanings, as far as the data processing system 10 or 20 is concerned. The "U" represents an unacceptable character, one which does possess alternative meanings as far as the data processing system 10 or 20 is concerned. The unacceptable character "U" may be misinterpreted by the data processing system to possess an alternative meaning, such as line feed or carriage return. When the unencoded original message is encoded, utilizing the encoding scheme of the prior art, the following encoded message is the result: AA, AA, AA, UU, AA, AA. Each character of the original message has been duplicated, that is, "A" has been transmitted as "AA" and "U" has been transmitted as "UU". Even though the character "U" is unacceptable and should not be transmitted in the context of message data, when it is received by a receiving data processing system in duplicated form (UU), the character "UU" is interpreted, not in the context of a special control character, such as line feed or carriage return, but in the context of the message character itself, which is its intended meaning. However, the original unencoded message has been doubled in length to a length "m". As a result, the character transmission rate from the first data processing system 10 to the second data processing system 20 has been halved from 30 characters per second to approximately 15 characters per second. Note that each transmitted character AA or UU has a length which is less than or equal to the width "d" of the channel. In order to improve this character transmission rate, a new encoding and decoding scheme is necessary.

Figure 3C:
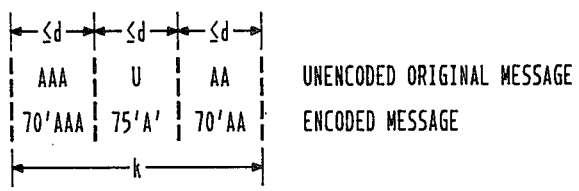
FIG. 3c illustrates an unencoded message and an encoded message which was encoded utilizing the encoding scheme of the subject invention.

In FIG. 3c, an unencoded original message and an encoded message, encoded utilizing a new encoding scheme according to the present invention, is illustrated. The unencoded original message is: A, A, A, U, A, A. The character "A" represents an acceptable character, and the character "U" represents an unacceptable character, as defined above. In order to encode the original message, rather than duplicate each character, another method is used. A bias code "70" is selected for the acceptable characters "A", and a bias code "75" is selected for the unacceptable character "U". The selection of a bias code will be discussed with reference to FIG. 7 of the drawings. The use of the bias code will become evident when the encoding/decoding technique of the present invention is described with reference to FIGS. 4–7 of the drawings. In lieu of transmitting the acceptable characters A, A, A in sequence, the characters are transmitted with their respective bias code. Therefore, the acceptable characters are transmitted as follows: 70', A, A, A. The unacceptable character "U" is transformed into an acceptable character "A'", and is transmitted with its bias code "75" as follows: 75', A'. The acceptable characters "A" need no such transformation, since they are already acceptable in form for transmission. Therefore, the acceptable characters "A, A" are transmitted with their respective bias code as follows 70', A, A. The following encoded message is the result: 70', A, A, A, 75', A', 70', A, A. Note that the total length of the encoded message is "k". As will become evident from a reading of the description of the invention with reference to FIGS. 4–7 of the drawings, the total length "k" of the encoded message utilizing the encoding scheme of the present invention is less than the total length "m" of the encoded message utilizing the encoding scheme of the prior art. Therefore, when utilizing the encoding scheme of the present invention, the character transmission rate has increased, relative to the prior art technique of FIG. 3b, during the transmission of a message from the first data processing system 10 to the second data processing system 20. Note also that the length of the message portion "70', A, A, A" is less than or equal to width "d" of the channel of FIG. 3a; similarly, the lengths of message portions "75', A'" and "70', A, A" are less than or equal to width "d" of the channel. A receiving data processing system, upon receiving the encoded message of FIG. 3c, interprets the bias code 70' as meaning that the following acceptable characters "A, A, A" or "A, A" should remain unaltered in form, but interprets the bias code 75' as meaning that the transformed acceptable character A' should be converted back into its original unacceptable form "U". Since the unacceptable character "U" has been received in its transformed form "75', A'", it will not be misinterpreted to possess any alternative meanings, such as line feed or carriage return, rather, it will be interpreted in the context of the message character "U" itself. When the receiving data processing system converts the transformed acceptable character back into its original unacceptable form, using bias code 75', and retains the acceptable characters in unaltered form, using bias code 70', the following original unencoded message is the result: A, A, A, U, A, A.

Figures 4, 5A, 5B:
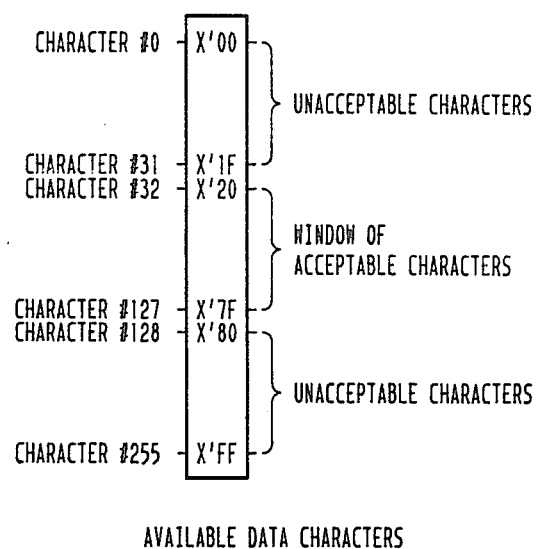
FIG. 4 is a sketch indicating the available data characters which comprise the characters of a message to be transmitted including a window of acceptable characters, the window representing a plurality of characters which are acceptable for transmission from the first data processing system to the second data processing system.
FIGS. 5a and 5b illustrate sample data prior to transmission and subsequent to transmission, the subsequently transmitted sample data having been encoded using the encoding technique of the subject invention, the subsequently transmitted sample data being decoded using the decoding technique of the subject invention.

Referring to FIGS. 4, 5a, and 5b, an example of the encoding process and decoding process of the present invention, practiced by the processors 10c and 20c utilizing the encoding and decoding algorithms stored in memories 10a and 20a, is illustrated.

In FIG. 5a, a typical example message is illustrated. This example message is utilized for purposes of illustration only and is not intended to be illustrative of an actual portion of message data. The example message comprises seven characters: X'10, X'10, X'50, X'51, X'52, X'53, and X'0D. The notation "X'ab" corresponds to the following mathematical relationship: $X'ab = a(16) + b$. For example, $X'53 = 5(16) + 3 = 83$. Some of the characters of the example message of FIG. 5a are acceptable characters, that is, acceptable characters do not also have a separate meaning relating to certain control functions of the computer system, such as line feed and carriage return. However, some of the characters are unacceptable characters, that is, unacceptable characters also have a separate meaning relating to the control functions of the computer system. Upon receiving an unacceptable character, a receiving data processing system would initiate the associated control function and would not interpret the unacceptable character in the context of its role in its message. Let us assume that the characters X'10, X'10, and X'0D of the FIG. 5a message are unacceptable characters which lie within the region of available data characters encompassed by characters 0–31 of FIG. 4 and that X'50, X'51, X'52, and X'53 are acceptable characters which lie within the region of available data characters encompassed by characters 32–127 of FIG. 4.

Referring to FIG. 4, a characterization of all available data characters capable of transmission is illustrated. In the FIG. 4 characterization, there are 256 characters available for transmission, character numbers 0 through 255 However, character numbers 0 through 31 (X'00 through X'1F) and numbers 128 through 255 (X'80 through X'FF) are codes which have an alternate meaning relating to certain control functions of the computer system. The existence of these codes in a message would trigger the execution of the particular control function and would not be interpreted in the context of the role it plays as a character in the message in which it was transmitted. Character numbers 32 through 127 (X'20 through X'7F) are a set of acceptable characters which do not have an alternate meaning. If one of these acceptable codes appear in a message, it would be interpreted in the context of the role its plays as the particular character in the message and would not trigger any other control functions. Characters numbers 32–127 (X'20–X'7F) are said to be "inside a window of acceptable characters", do not need to be altered, and may be transmitted unchanged. In the example of FIG. 5a, the characters X'50, X'51, X'52, and X'53 are the only characters which fall within the window of acceptable characters of FIG. 4 defined by character numbers 32 through 127 (X'20 through X'7F).

Referring to FIGS. 5a and 5b, the message of FIG. 5a contains acceptable characters X'50, X'51, X'52, and X'53 (they do not convey an alternate meaning) and unacceptable characters X'10, X'10, and X'0D (they do convey an alternate meaning, such as line feed or carriage return). Therefore, the message of FIG. 5a cannot be transmitted in its present form. The unacceptable characters must be converted, encoded to acceptable characters prior to transmitting the message. Consequently, the message of FIG. 5a must be converted (encoded) to the message of FIG. 5b. Once converted, the message of FIG. 5b is transmitted from data processing system 10 to data processing system 20. When received by the data processing system 20, the message of FIG. 5b must be re-converted (decoded) into the message of FIG. 5a.

The process practiced by processors 10c and 20c, in association with the encoding algorithm stored in memories 10a and 20a, of converting/encoding the message of FIG. 5a into the message of FIG. 5b is set forth in the following paragraph with reference to FIGS. 5a and 5b.

Assuming that the message data of FIG. 5a is being transmitted from data processing system 10 to data processing system 20, having received the message data of FIG. 5a, processor 10c executes the encoding algorithm stored in memory 10a. The processor 10c in association with the encoding algorithm examines each character of FIG. 5a. When the first character X'10 is examined, the processor 10c determines that this character is outside the window of FIG. 4. The processor 10c selects a bias code "X'75". Associated with this bias code is a unique delta code "X'50".

The manner by which the processor selects a bias code corresponding to the character being encoded and a delta code corresponding to the selected bias code will be discussed with reference to FIG. 7 of the drawings.

When the bias code "X'75" is selected, its delta code "X'50" is determined. The delta code X'50 is then added to the first character "X'10", yielding the sum "X'60". As a result, the unacceptable first character X'10 has been converted, encoded, into the following acceptable encoded character sequence: X'75 X'60. Note that this acceptable encoded character sequence is the first two characters of the message of FIG. 5b. When the second character X'10 is examined, the processor 10c determines that this character is outside the window of FIG. 4. Since the first character X'10 was also outside the window, and the bias code X'75 was selected for the first character, there is no need to select another bias code for the second character. The second character X'10 will use the same bias code "X'75". As noted above, the delta code X'50 is uniquely associated with bias code X'75. Therefore, the processor 10c adds the delta code X'50 to the second character X'10 to yield X'60. As a result, the unacceptable second character X'10 has been converted, encoded, into the following acceptable second encoded character: X'60. Note that this acceptable second encoded character is the second character of the message of FIG. 5b. When the third character X'50 of the FIG. 5a message is examined by processor 10c, it is determined that this third character X'50 is inside the window of FIG. 4. Therefore, the processor 10c selects a new bias code "X'70". Since the third character X'50 of the FIG. 5a message is within the window of FIG. 4, there is no need to alter or encode the character. A delta code "0" is uniquely associated with bias code X'70. As a result, the delta code "0" is added to the third character X'50 of the FIG. 5a message resulting in a further character "X'50" of the FIG. 5b message. Therefore, the third character X'50 of the FIG. 5a message has been converted, encoded, into the following character of the FIG. 5b message: X'70 X'50. The fourth, fifth, and sixth characters of the FIG. 5a message are X'51, X'52, and X'53. All of these characters fall within the window of FIG. 4. There is no need to select another bias code, because the bias code "X'70", selected in association with the third character X'50 of the FIG. 5a message, is still applicable with respect to characters X'51, X'52, and X'53. Therefore, the processor 10c determines that delta code "0" is uniquely associated with bias code X'70, and adds the delta code "0" to characters X'51, X'52, and X'53, resulting in the same characters X'51, X'52, and X'53, which form a part of the FIG. 5b message. Therefore, the fourth, fifth, and sixth characters of the FIG. 5a message have been converted, encoded, into the following characters of the FIG. 5b message: X'51, X'52, and X'53. The final character of the FIG. 5a message is "X'0D". The processor 10c determines that this character is outside the window of FIG. 4. Since bias code "X'75" was selected in association with the first and second characters of the FIGS. 4a and 4b messages, the same bias code is selected for the final character "X'0D". This bias code is uniquely associated with the delta code "X'50". The processor 10c adds the delta code "X'50" to the final character "X'0D" to yield the character "X'5D". Therefore, the final character "X'0D" has been converted, encoded into the following character sequence, which forms the final portion of the FIG. 5b message: X'75 X'5D. The encoding of the FIG. 5a message is complete, and the message of FIG. 5b is the result.

The process by which the decoding algorithm, in association with the processor 20c, decodes the message of FIG. 5b to produce the message of FIG. 5a is set forth in the following paragraphs with reference to FIGS. 5a and 5b.

The processor 20c examines each character in the message of FIG. 5b. The first and second characters X'75 X'60 are examined, the first character X'75 being a bias code. As will be discussed with reference to FIG. 7, the bias code X'75 has a unique delta code X'50 associated therewith. Since the decoding algorithm is being utilized, the bias code X'75 indicates that the delta code X'50 must be subtracted from the number 1 X'60 in the second character. When X'50 is subtracted from X'60, the number X'10 is result. As a result, X'10 is the first character of the decoded message of FIG. 5a. If another bias code is not encountered with respect to the third character X'60 of the FIG. 5b message, the previous bias code is utilized, in this case, the bias code X'75. Therefore, as before, since the previous bias code X'75 is being used in association with the third character X'60, the delta code X'50, associated with bias code X'75, is subtracted from the third character X'60 of the FIG. 5b message, yielding the number X'10 once again. Therefore, X'10 constitutes the second character of the FIG. 5a message. With respect to fourth and fifth characters X'70 X'50 of the FIG. 5b message, a new bias code X'70 is encountered. This bias code has a unique delta code "0" associated therewith. Since the decoding algorithm is being utilized, bias code X'70 indicates that the delta code "0" must be subtracted from the fifth character X'50 of the FIG. 5b message. When this subtraction is accomplished, the number X'50 is the result. Therefore, X'50 is the third character of the FIG. 5a message. The sixth, seventh, and eighth characters of the FIG. 5b message, X'51, X'52, and X'53, do not have another bias code associated therewith. Therefore, the previous bias code X'70 is utilized. As a result, as before, the delta code "0" is subtracted from each of the sixth, seventh, and eighth characters, X'51, X'52, and X'53 of the FIG. 5b message. The difference is X'51, X'52, and X'53. These numbers constitute the fourth, fifth, and sixth characters of the FIG. 5a message. When the processor 20c examines the seventh and eighth characters, X'75, X'5D of the FIG. 5b message, a new bias code X'75 is encountered. This bias code was used in association with the first and second characters of the FIG. 5b message and has the delta code X'50 uniquely associated therewith. The delta code X'50 is subtracted from the eighth character, "X'5D", of the FIG. 5b message. The difference is the number "X'0D". As a result, the number "X'0D" constitutes the last character of the FIG. 5a message. The resultant decoded message is illustrated in FIG. 5a.

The encoding/decoding process of the present invention increases the character transmission rate, associated with the transmission of message characters from the first data processing system to the second data processing system 20, from 15 characters/second to approximately 25 characters/second; in addition, it achieves a kind of data compression, in that the original message character length of 7 characters increased to approximately 10 characters during the encoding process utilizing the process of the subject invention whereas the message character length is increased to approximately 14 characters during the encoding process utilizing the process of the prior art.

Figures 6, 7:
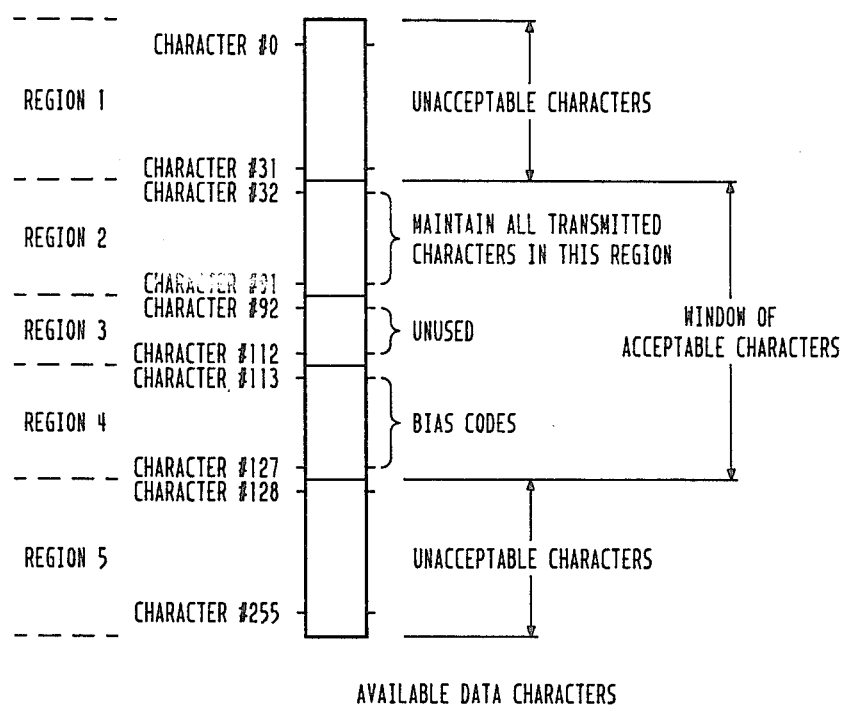
FIG. 6 illustrates a detailed construction of the sketch of FIG. 4.
FIG. 7 illustrates a table of bias codes including corresponding delta codes and first position data.

Referring to FIG. 6, a more detailed construction of the sketch of FIG. 4 is illustrated. FIG. 6 illustrates a detailed characterization of all available data characters capable of transmission from the first data processing system 10 to the second data processing system 20. In FIG. 6, as in FIG. 4, there are 256 characters available for transmission, characters 0 through 255. As before, characters 0-31, which lie within region 1 of FIG. 6, and characters 128-255, which lie within region 5 of FIG. 6, are unacceptable characters, ones which possess alternative meanings, such as line feed and carriage return. If these characters are transmitted in the context of message data, they will be misinterpreted to mean, for example, line feed or carriage return, and not the character in the message which is its intended meaning. As before, characters 32 through 127 are "within the window of acceptable characters" and are therefore acceptable characters, ones which do not possess any alternative meaning. However, the window of acceptable characters (characters 32-127) are further comprised of three regions, region 2, including characters 32-91, region 3, including characters 92-112, and region 4, including characters 113-127. Region 3 is not used. Region 4 includes all bias codes, described above with reference to FIGS. 5a and 5b, for transforming unacceptable characters into acceptable characters. All characters to be transmitted from the first data processing system 10 to the second data processing 20, with the exception of the bias codes of region 4, should lie within region 2. Therefore, if an unacceptable character in a message lies within region 1, the character is cross referenced to a bias code and a delta code. Since the unacceptable character of region 1 lies within a region of characters which are less in magnitude than the characters of region 2, the corresponding delta code is added to the unacceptable character thereby transforming the unacceptable character into a new acceptable character which lies within region 2. When the new acceptable character is transmitted from the first data processing system 10 to the second data processing 20, it is transmitted with its bias code. At the receiving system 20, the bias code is interpreted to mean that the delta code should be subtracted from the new acceptable character of region 2 yielding the original unacceptable character of region 1. Similarly, if a character in a message lies within region 3, within region 4 and is not a bias code, or within region 5, the character is cross referenced to a bias code and a delta code. Since the character to be transmitted lies within a region of characters which are greater in magnitude than the characters of region 2, the corresponding delta code is actually subtracted from the character yielding a new, acceptable character which lies within region 2, the new acceptable character being transmitted along with its bias code from the first data processing system 10 to the second data processing system 20. At the receiving system 20, the bias code is interpreted mean that the delta code should be added to the new, acceptable character of region 2 to yield the character of region 3, 4, or 5.

Therefore, if an unacceptable character is encountered in a message to be transmitted from the first data processing system 10 to the second data processing system 20, and the character lies within regions 1, 3, 4, or 5 of FIG. 6, the unacceptable character is cross referenced to a bias code and a delta code, the bias code lying within region 4; the delta code is either added to or subtracted from the character thereby creating a new character which lies within region 2; the bias code and the new character is transmitted to the second data processing system 20; and the second system 20 interprets the bias code to mean that the delta code should be subtracted from or added to, respectively, the new character thereby yielding the original unacceptable character of regions 1, 3, 4 or 5.

Referring to FIG. 7, a table of bias codes including corresponding delta codes and first position data is illustrated. This table is used to cross reference an unacceptable character of regions 1, 3, 4 or 5 of FIG. 6 to its corresponding the bias code and delta code. The following discussion relates to the use of the table in determining the bias codes and the delta codes corresponding to the following unacceptable characters: "05", "1F", and "A5".

Assume that the unacceptable character "05" is intended for transmission from the first data processing system 10 to the second data processing system 20 and must be encoded. The first character of the unacceptable character "05" is the character "0". This character "0" is located in the table of FIG. 7 under the column labelled "first position". The character "0" is located under the first position column in the first row of the table. Bias code "75" and delta code "50" are associated with the first position character "0". The bias code and delta code is used in the manner discussed with reference to FIGS. 3 through 6 of the drawings. Assume that the unacceptable character, which must be encoded, is "1F". The first position character is "1". The first position character "1" is located in the table of FIG. 7 under the column labelled "first position". Bias code 75 and delta code 50 is located. Assume that the unacceptable character, which must be encoded, is "A5". The first position character is "A". The "A" is located in the table of FIG. 7 under the column labelled "first position". Bias code "7B" and delta code "B0" is located.

Assume an encoded character, "7B55", has been received by a receiving data processing system 20 and must be decoded. The processor 20c notes the bias code "7B" and utilizes the table of FIG. 7 to cross-reference the bias code to delta code "B0". This delta code is used to derive the original unacceptable character in the manner discussed with reference to FIGS. 3-6 of the drawings.

A description of the encoding algorithm stored in memory 10a and 20a of the computer system of FIG. 1, in accordance with the present invention, is set forth in the following paragraphs with reference to FIG. 8 of the drawings.

Figure 8:
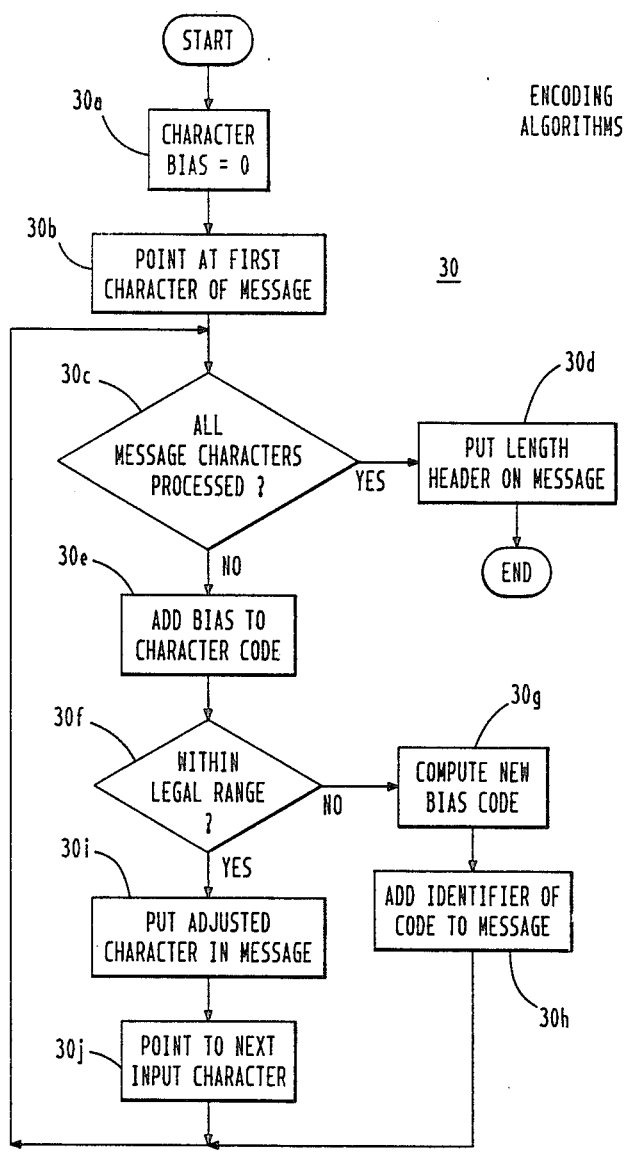
FIGS. 8 and 9 illustrate flow charts of the encoding and decoding algorithm, stored in the memory of the data processing systems of FIG. 1, according to the present invention.

In FIG. 8, the encoding algorithm 30 begins by setting the character bias (bias code) to zero, block 30a. Point to the first character of the message, block 30b. Are all message characters processed, block 30c. If yes, put the length header on the message, block 30d, and end. If no, add the bias (bias code) to the character code, block 30e. Is the new character, which results from the addition of block 30e, in the legal range, block 30f? If no, compute the new bias code, block 30g, and add an identifier of the code to the message, block 30h. Return to the input of block 30c. If yes, put the adjusted character in the message, block 30i, and point to the next input character, block 30j. Return to the input of block 30c.

A description of the decoding algorithm stored in the memory 10a and 20a of the computer system of FIG. 1, in accordance with the present invention, is set forth in the following paragraphs with reference to FIG. 9 of the drawings.

Figure 9:
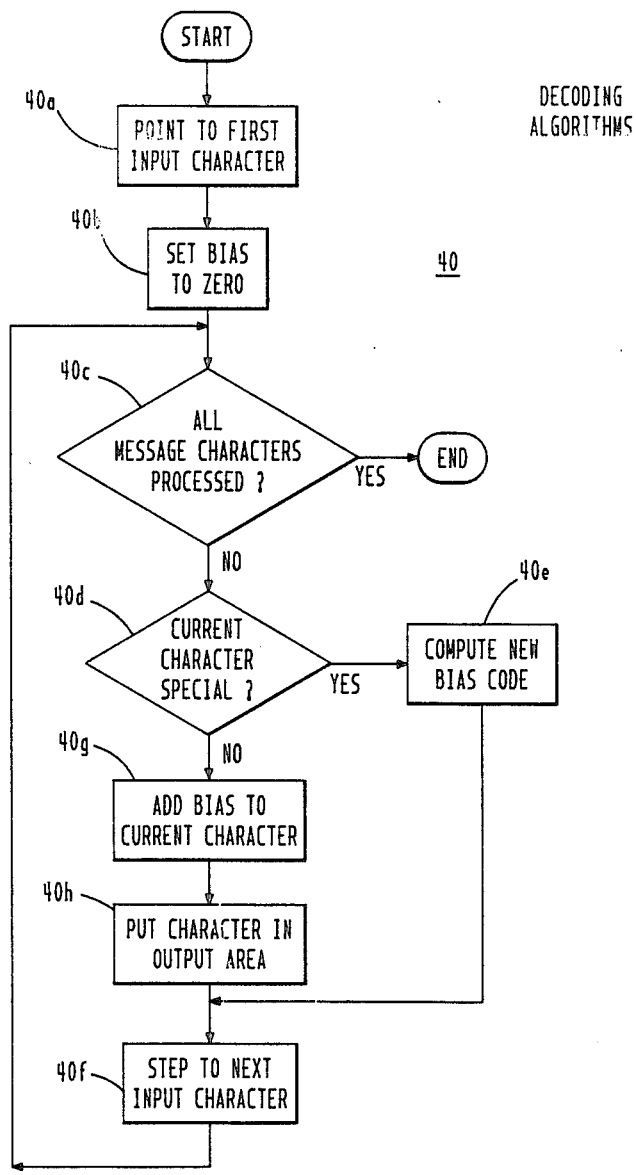

In FIG. 9, the decoding algorithm 40 begins by pointing to the first input character, block 40a. The bias (bias code) is set to zero, block 40b. Are all characters processed, block 40c? If yes, end. If no, is the current character special, block 40d? If yes, compute a new character bias code, block 40e, step to the next input character, block 40f, and return to the input of block 40c. If no, add the bias to the current character, block 40g, put the new character in the output area, block 40h, and step to the next input character, block 40f. Return to the input of block 40c.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A method of encoding characters of a message to be transmitted from one system to another system, of transmitting the encoded characters, and of decoding the encoded characters following transmission when said encoded characters are received by said another system, said characters of the message including a group of acceptable characters, ones which possess a single meaning, and a group of unacceptable characters, ones which possess multiple meanings, comprising the steps of:

defining a first bias code for the group of acceptable characters and defining a second bias code for the group of unacceptable characters;

modifying each of the unacceptable characters to produce modified acceptable characters, the modifying step including the steps of cross-referencing said second bias code in a table to a delta code, and performing an arithmetic operation on said unacceptable characters, using said delta code, to produce said modified acceptable characters;

associating for transmission the first bias code with the acceptable characters producing a first character set;

associating for transmission the second bias code with the modified acceptable characters producing a second character set; and transmitting said first character set and said second character set from said one system to said another system.

2. The method of claim 1, wherein the step of defining a first bias code and the step of defining a second bias code each comprise the step of: using the acceptable characters or unacceptable characters, locating at least a portion of the characters in a table and cross-referencing said portion of said characters in said table to said first bias code and said second bias code.

3. The method of claim 1, further comprising the steps of:

following the transmitting step, receiving said first character set and said second character set in said another system, the receiving step further comprising the steps of:

receiving said first character set, interpreting said first bias code of said first character set, and maintaining the received acceptable characters unchanged in response to the step of interpreting said first bias code;

receiving said second character set, interpreting said second bias code of said second character set, and re-modifying the modified acceptable characters to produce said unacceptable characters in response to the step of interpreting said second bias code; and associating together the received acceptable characters and the received, produced unacceptable characters thereby reconstructing said characters of a message;

whereby the encoded characters have been decoded.

4. A method of encoding characters of a message to be transmitted from one system to another system, of transmitting the encoded characters, and of decoding the encoded characters following transmission when said encoded characters are received by said another system, said characters of the message including a group of acceptable characters, ones which possess a single meaning, and a group of unacceptable characters, ones which possess multiple meanings, comprising the steps of:

defining a first bias code for the group of acceptable characters and defining a second bias code for the group of unacceptable characters, the step of defining a first bias code and the step of defining a second bias code each comprising the step of, using the acceptable characters or unacceptable characters, locating at least a portion of the characters in a table and cross-referencing said portion of said characters in said table to said first bias code and said second bias code;

modifying each of the unacceptable characters to produce modified acceptable characters, the modifying step comprising the steps of cross-referencing said second bias code in said table to a delta code, and performing an arithmetic operation on said unacceptable characters, using said delta code, to produce said modified acceptable characters;

associating for transmission the first bias code with the acceptable characters producing a first character set;

associating for transmission the second bias code with the modified acceptable characters producing a second character set; and transmitting said first character set and said second character set from said one system to said another system.

5. A method of encoding characters of a message to be transmitted from one system to another system, of transmitting the encoded characters, and of decoding the encoded characters following transmission when said encoded characters are received by said another system, said characters of the message including a group of acceptable characters, ones which possess a single meaning, and a group of unacceptable characters, ones which possess multiple meanings, comprising the steps of:

defining a first bias code for the group of acceptable characters and defining a second bias code for the group of unacceptable characters, the step of defining a first bias code and the step of defining a second bias code each comprising the step of, using the acceptable characters or unacceptable characters, locating at least a portion of the characters in a table and cross-referencing said portion of said characters in said table to said first bias code and said second bias code;

modifying each of the unacceptable characters to produce modified acceptable characters;

associating for transmission the first bias code with the acceptable characters producing a first character set;

associating for transmission the second bias code with the modified acceptable characters producing a second character set;

performing an operation on each of said acceptable characters to produce the same said acceptable characters, said performing step further comprising the steps of, cross-referencing said first bias code in said table to locate a delta code, and performing an arithmetic operation on said acceptable characters, using said delta code, to produce the same said acceptable characters; and transmitting said first character set and said second character set from said one system to said another system.

6. A method of encoding characters of a message to be transmitted from one system to another system, of transmitting the encoded characters, and of decoding the encoded characters following transmission when said encoded characters are received by said another system, said characters of the message including a group of acceptable characters, ones which possess a single meaning, and a group of unacceptable characters, ones which possess multiple meanings, comprising the steps of:

defining a first bias code for the group of acceptable characters and defining a second bias code for the group of unacceptable characters;

modifying each of the unacceptable characters to produce modified acceptable characters;

associating for transmission the first bias code with the acceptable characters producing a first character set;

associating for transmission the second bias code with the modified acceptable characters producing a second character set; transmitting said first character set and said second character set from said one system to said another system;

receiving said first character set and said second character set in said another system, the receiving step further comprising the steps of:

receiving said first character set, interpreting said first bias code of said first character set, and maintaining the received acceptable characters unchanged in response to the step of interpreting said first bias code, receiving said second character set, interpreting said second bias code of said second character set, and re-modifying the modified acceptable characters to produce said unacceptable characters in response to the step of interpreting said second bias code, the step of re-modifying the modified acceptable characters in response to the interpreting step comprising the steps of locating said second bias code in a table, cross-referencing in said table to a delta code, and performing an arithmetic operation on said modified acceptable characters, using said delta code, to produce said unacceptable characters; and associating together the received acceptable characters and the received, produced unacceptable characters thereby reconstructing said characters of a message;

whereby the encoded characters have been decoded.

* * * * *